United States Patent

Takagi

[11] Patent Number: 5,721,752
[45] Date of Patent: Feb. 24, 1998

[54] SEMICONDUCTOR LASER DEVICE

[75] Inventor: Kazuhisa Takagi, Tokyo, Japan

[73] Assignee: Mitsubishi Denki Kabushiki Kaisha, Tokyo, Japan

[21] Appl. No.: 667,819

[22] Filed: Jun. 20, 1996

[30] Foreign Application Priority Data

Dec. 15, 1995 [JP] Japan ................. 7-327028

[51] Int. Cl.$^6$ ................. H01S 3/19; H01S 3/10
[52] U.S. Cl. ................. 372/49; 372/21; 372/45
[58] Field of Search ................. 372/49, 21, 45, 372/11; 359/72; 427/164

[56] References Cited

U.S. PATENT DOCUMENTS

| | | | |
|---|---|---|---|
| 4,337,443 | 6/1982 | Umeda et al. | 372/49 |
| 4,732,783 | 3/1988 | Choe et al. | 427/164 |
| 4,751,708 | 6/1988 | Jackson et al. | 372/49 |
| 5,130,830 | 7/1992 | Fukushima | 359/72 |
| 5,224,113 | 6/1993 | Tsang | 372/49 |

FOREIGN PATENT DOCUMENTS

| | | | |
|---|---|---|---|
| 5543822 | 3/1980 | Japan | 372/49 |
| 5543884 | 3/1980 | Japan | 372/49 |
| 55-115386 | 9/1980 | Japan . | |
| 58-110087 | 6/1983 | Japan | 372/49 |
| 62-296490 | 12/1987 | Japan . | |
| 4329687 | 11/1992 | Japan . | |

OTHER PUBLICATIONS

Waynant et al, Electro–Optics Handbook, New York: McGraw–Hill, Inc., (no month available) 1994, pp.11.48–11.49.

Extended Abstract 28p–K–5, Japan Society of Applied Physics, 1994.

Sections 16.0, 16.1, 16.2, and 16.3 from Optical Electronics, Third Edition, pp. 499–503 (no month available) 1985: New York: CBS College Publishing, 1985.

*Primary Examiner*—Brian Healy
*Assistant Examiner*—Luong-Quyen T. Phan
*Attorney, Agent, or Firm*—Leydig, Voit & Mayer, Ltd.

[57] ABSTRACT

A semiconductor laser device includes an active layer from which laser light is emitted, a front facet reflection film, a back facet reflection film, and a resonator including the front and back facet reflection films, at least one of the front and back facet reflection films includes a saturable absorber to the laser light and, a thickness d of the facet reflection film comprising a saturable absorber is represented by $$d = \frac{\lambda}{n}\left(\frac{1}{4} + \frac{M}{2}\right) (M=0,1,2\ldots)$$

where n is a refractive index of the facet reflection film comprising a saturable absorber to a wavelength λ of the laser light. Therefore, independently of a differences in optical confinement coefficient and in differential gain between a region where a current flows and a region where no current flows in the active layer, self-pulsation in which the emitted light is pulsed light having high frequency occurs easily, whereby a self-pulsation semiconductor laser device having good laser characteristics, such as a transverse mode characteristic and a threshold current characteristic, is obtained. Consequently, a wider margin of device design is afforded than in the prior art device, whereby the device is stably fabricated with a good yield.

11 Claims, 7 Drawing Sheets

SEMICONDUCTOR LASER DEVICE

FIELD OF THE INVENTION

The present invention relates to a semiconductor laser device and, more particularly, to a self-pulsation semiconductor laser device used for an optical disk drive or the like.

BACKGROUND OF THE INVENTION

In an optical disk device, a semiconductor laser is used for reading and writing information. The semiconductor laser is weak in return light from the optical disk and, as the return light becomes stronger, luminous intensity noise becomes larger, whereby a defect in the reading writing of information is produced.

In order to avoid the above-described problem, a self-pulsation semiconductor laser device, in which emitted light is pulsed light having a frequency of several tens of Megahertz (MHz) to several gigahertz (GHz), is used for the semiconductor laser. When the emitted light of the laser is pulsed light having a high frequency, the emission of the pulsed light in the laser is completed before the pulsed light is reflected by the disk and returns to the laser. Therefore, interference between the light emitted from the laser and the reflected return light is prevented.

FIG. 11 is a cross-sectional view illustrating a prior art self-pulsation semiconductor laser device. The cross-section in the figure is a plane perpendicular to the direction in which light is emitted. In the figure, the laser includes an n type GaAs substrate, 7 and an n type AlGaAs cladding layer 6, an AlGaAs active layer 5, a p type AlGaAs cladding layer 4, an n type GaAs current blocking layer 3, and a p type GaAs contact layer 2 successively disposed on the n type GaAs substrate 7. A p side electrode 1 is provided on the p type GaAs contact layer 2 and an n side electrode 8 is provided at the rear surface of the n type GaAs substrate 7. The active layer 5 includes a region 5a where a current flows and regions 5b where no current flows. The laser light emitted from the region 5a is present also in the regions 5b. The active layer 5, and the cladding layers 4 and 6 make a resonator, and a front facet reflection film (not shown) having a low reflectivity and comprising $Al_2O_3$ or $SiO_2$ is disposed on a front facet of the resonator and a back facet reflection film (not shown) having a high reflectivity and comprising a plurality of $SiO_2$ and Si layers which are laminated is disposed on a back facet of the resonator.

A description is given of the operation of the self-pulsation semiconductor laser device.

On the regions 5a and 5b of the active layer 5, rate equations are set up as follows:

$$\frac{dS_a}{dt} = \Gamma_a G'_a S_a (N_a - N_g) - \frac{1}{\tau_p} S_a + C \frac{N_a}{\tau_s} \quad (\equiv f_1) \quad (1)$$

$$\frac{dS_b}{dt} = \Gamma_b G'_b S_b (N_b - N_g) - \frac{1}{\tau_p} S_b + C \frac{N_b}{\tau_s} \quad (\equiv f_2) \quad (2)$$

$$\frac{dN_a}{dt} = \frac{I \eta_i}{q V_a} - \Gamma_a G'_a S_a (N_a - N_g) - \frac{1}{\tau_s} N_a \quad (\equiv f_3) \quad (3)$$

$$\frac{dN_b}{dt} = -\Gamma_b G'_b S_b (N_b - N_g) - \frac{1}{\tau_s} N_b \quad (\equiv f_4) \quad (4)$$

where $N_a$ is the electron density of the region 5a, $N_b$ is the electron density of the region 5b, $S_a$ is the photon density of the region 5a, $S_b$ is the photon density of the region 5b, $\Gamma_a$ is the optical confinement coefficient of the region 5a, $\Gamma_b$ is the optical confinement coefficient of the region 5b, $G'_a$ is the differential gain of the region 5a, $G'_b$ is the differential gain of the region 5b, $N_g$ is the transparentized carrier density of the regions 5a and 5b, $\tau_p$ is the photon lifetime of the regions 5a and 5b, $\tau_s$ is the carrier lifetime of the regions 5a and 5b, C is the spontaneous emission light coefficient of the regions 5a and 5b, t is time, $\eta_i$ is the internal quantum efficiency, $V_a$ is the volume of the active layer, I is current flowing through the active layer, and q is elementary electronic charge. When the solutions $(N_a, N_b, S_a, S_b)$,=$(n_a, n_b, s_a, s_b)$ which are obtained by the rate equations (1)–(4), are unstable for the time t, laser self-pulsation occurs. From the condition of the stability of the dynamic system, the necessary and sufficient condition is that at least one of four eigenvalues of the matrix $$\begin{pmatrix} \frac{\partial f_1}{\partial S_a} & \frac{\partial f_1}{\partial S_b} & \frac{\partial f_1}{\partial N_a} & \frac{\partial f_1}{\partial N_b} \\ \frac{\partial f_2}{\partial S_a} & \frac{\partial f_2}{\partial S_b} & \frac{\partial f_2}{\partial N_a} & \frac{\partial f_2}{\partial N_b} \\ \frac{\partial f_3}{\partial S_a} & \frac{\partial f_3}{\partial S_b} & \frac{\partial f_3}{\partial N_a} & \frac{\partial f_3}{\partial N_b} \\ \frac{\partial f_4}{\partial S_a} & \frac{\partial f_4}{\partial S_b} & \frac{\partial f_4}{\partial N_a} & \frac{\partial f_4}{\partial N_b} \end{pmatrix}_{\substack{N_a=n_a \\ N_b=n_b \\ S_a=s_a \\ S_b=s_b}} \quad (5)$$

has a real part which is 0 or positive.

In order to apply the self-pulsation semiconductor laser to an optical disk system, it is required to produce the self-pulsation with $S_a$ in a wide range. Therefore, the difference between $\Gamma_a$ and $\Gamma_b$ and the difference between $G'_a$ and $G'_b$ of the variables must be increased as much as possible. Because, when $\Gamma_a$ is almost equal to $\Gamma_b$ and $G'_a$ is almost equal to $G'_b$, the dynamic system which is given by the equations (1)–(4) is represented by only the equations (1) and (3) and the eigenvalues of the matrix $$\begin{pmatrix} \frac{\partial f_1}{\partial N_a} & \frac{\partial f_1}{\partial S_a} \\ \frac{\partial f_3}{\partial N_a} & \frac{\partial f_3}{\partial S_a} \end{pmatrix} \quad (6)$$

do not have real parts which are not negative, whereby a light output corresponding to $S_a$ is always stable for the time t and self-pulsation operation does not occur.

However, if the difference between the optical confinement coefficients $\Gamma_a$ and $\Gamma_b$ and the difference between the differential gains $G'_a$ and $G'_b$ in the regions 5a and 5b are increased, deterioration of semiconductor laser characteristics, such as deterioration of a transverse mode characteristic of the laser light and a rise in an oscillating threshold current, is caused. Therefore, there are limits to the increased differences. In addition, in order to keep the difference in optical confinement coefficients and the difference in differential gains between the regions 5a and 5b constant values, it is required to control the structure and the material in the vicinity of the active layer. For that purpose, for example, the thickness of the cladding layer on the region 5b of the active layer where no current flows is controlled. However, it is difficult to control this thickness to be in a range in which self-pulsation always occurs.

Therefore, the margin of device design for both good semiconductor laser characteristics and fine self-pulsation operation is narrow, whereby the yield of the self-pulsation semiconductor laser device is greatly affected by the stability of processes in fabricating the laser device.

SUMMARY OF THE INVENTION

It is an object of the present invention to provide a self-pulsation semiconductor laser device in which the transverse mode characteristic and the threshold current characteristic are good, self-pulsation occurs easily, and the margin of device design is wide.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a semiconductor laser device includes an active layer from which laser light is emitted and a resonator having a front facet reflection film and a back facet reflection film, in which at least one of the front and back facet reflection films comprises a saturable absorber to the laser light and, a thickness d of the facet reflection film comprising a saturable absorber is represented by $$d = \frac{\lambda}{n} \left( \frac{1}{4} + \frac{M}{2} \right) (M = 0, 1, 2, \ldots )$$

where n is a refractive index of the facet reflection film comprising a saturable absorber to a wavelength $\lambda$ of the laser light. Therefore, independently of the differences in optical confinement coefficient and in differential gain between a region where a current flows and a region where no current flows in the active layer, self-pulsation in which the emitted light is pulse light having a high frequency occurs easily, whereby a self-pulsation semiconductor laser device having good laser characteristics, such as a transverse mode characteristic and a threshold current characteristic, is obtained. Consequently, in this self-pulsation semiconductor laser device, a wider margin of device design is afford than in the prior art device, whereby the self-pulsation semiconductor laser device is stably fabricated with a good yield.

According to a second aspect of the present invention, in the above-described semiconductor laser device, a material of the active layer is AlGaAs, and the facet reflection film comprises AlGaAs having a band gap energy smaller than that of the material of the active layer. Therefore, the facet reflection film comprising AlGaAs serves as a saturable absorber to the laser light emitted from the active layer, whereby the self-pulsation occurs easily.

According to a third aspect of the present invention, in the above-described semiconductor laser device, a material of the active layer is AlGaInP, and the facet reflection film comprises AlGaInP having a band gap energy smaller than that of the material of the active layer. Therefore, the facet reflection film comprising AlGaInP serves as a saturable absorber to the laser light emitted from the active layer, whereby the self-pulsation occurs easily.

According to a fourth aspect of the present invention, in the above-described semiconductor laser device, a material of the active layer is AlGaInP, and the facet reflection film comprises AlGaAs having a band gap energy smaller than that of the material of the active layer. Therefore, the facet reflection film comprising AlGaAs serves as a saturable absorber to the laser light emitted from the active layer, whereby the self-pulsation occurs easily.

According to a fifth aspect of the present invention, in the above-described semiconductor laser device, a material of the active layer is one selected from ZnMgSSe and ZnMgCdSSe, and the facet reflection film comprises one selected from AlGaAs and AlGaInP having a band gap energy smaller than that of the material of the active layer. Therefore, the facet reflection film comprising one selected from AlGaAs and AlGaInP serves as a saturable absorber to the laser light emitted from the active layer, whereby the self-pulsation occurs easily.

According to a sixth aspect of the present invention, in the above-described semiconductor laser device, a material of the active layer is InGaAsP, and the facet reflection film comprises InGaAsP having a band gap energy smaller than that of the material of the active layer. Therefore, the facet reflection film comprising InGaAsP serves as a saturable absorber to the laser light emitted from the active layer, whereby the self-pulsation occurs easily.

According to a seventh aspect of the present invention, in the above-described semiconductor laser device, a material of the active layer is one selected from AlGaAs, AlGaInP, ZnMgSSe, and ZnMgCdSSe and the facet reflection film comprises InGaAsP having a band gap energy smaller than that of the material of the active layer. Therefore, the facet reflection film comprising InGaAsP serves as a saturable absorber to the laser light emitted from the active layer, whereby the self-pulsation occurs easily.

According to an eighth aspect of the present invention, in the above-described semiconductor laser device, a material of the active layer is one selected from AlGaAs, AlGaInP, ZnMgSSe, ZnMgCdSSe, and InGaAsP and the facet reflection film comprises Ge having a band gap energy smaller than that of the material of the active layer. Therefore, the facet reflection film comprising Ge serves as a saturable absorber to the laser light emitted from the active layer, whereby the self-pulsation occurs easily.

According to a ninth aspect of the present invention, a semiconductor laser device includes an active layer from which laser light is emitted and a resonator having a front facet reflection film and a back facet reflection film, in which at least one of the front and back facet reflection films comprises a nonlinear optical material of which a refractive index varies depending on a photon density and, a thickness d of the facet reflection film comprising a nonlinear optical material is represented by $$d = \frac{\lambda}{n} \left( \frac{1}{4} + \frac{M}{2} \right) (M = 0, 1, 2, \ldots )$$

where n is a refractive index of the facet reflection film comprising a nonlinear optical material to a wavelength $\lambda$ of the laser light. Therefore, independently of the differences in optical confinement coefficient and in differential gain between a region where a current flows and a region where no current flows in the active layer, self-pulsation in which the emitted light is pulse light having a high frequency occurs easily, whereby a self-pulsation semiconductor laser device having good laser characteristics, such as a transverse mode characteristic and a threshold current characteristic, is obtained. Consequently, in this self-pulsation semiconductor laser device, a wider margin of device design is afford than in the prior art device, whereby the self-pulsation semiconductor laser device is stably fabricated with a good yield.

According to a tenth aspect of the present invention, in the above-described semiconductor laser device, the nonlinear optical material of the facet reflection film comprises 2-methyl-4-nitroaniline. Therefore, the facet reflection film comprising 2-methyl-4-nitroaniline serves as a saturable absorber to the laser light emitted from the active layer, whereby the self-pulsation occurs easily.

According to an eleventh aspect of the present invention, in the above-described semiconductor laser device, the nonlinear optical material of the facet reflection film comprises PTS polydiacethylene. Therefore, the facet reflection film comprising PTS polydiacethylene serves as a saturable absorber to the laser light emitted from the active layer, whereby the self-pulsation occurs easily.

DETAILED DESCRIPTION OF THE PREFERRED EMBODIMENT

[Embodiment 1]

A description is given of a first embodiment of the present invention.

A semiconductor laser device according to the first embodiment is a self-pulsation semiconductor laser device including a reflection film on a back facet of a resonator comprising a saturable absorber. The thickness $d_2$ of the saturable absorber is represented by $$d_2 = \left(\frac{1}{4} + \frac{M}{2}\right)\frac{\lambda}{n_2} \quad (M = 0, 1, 2, \ldots)$$

where $\lambda$ is the wavelength of the emitted laser light and $n_2$ is the refractive index of the saturable absorber.

Figure 1:
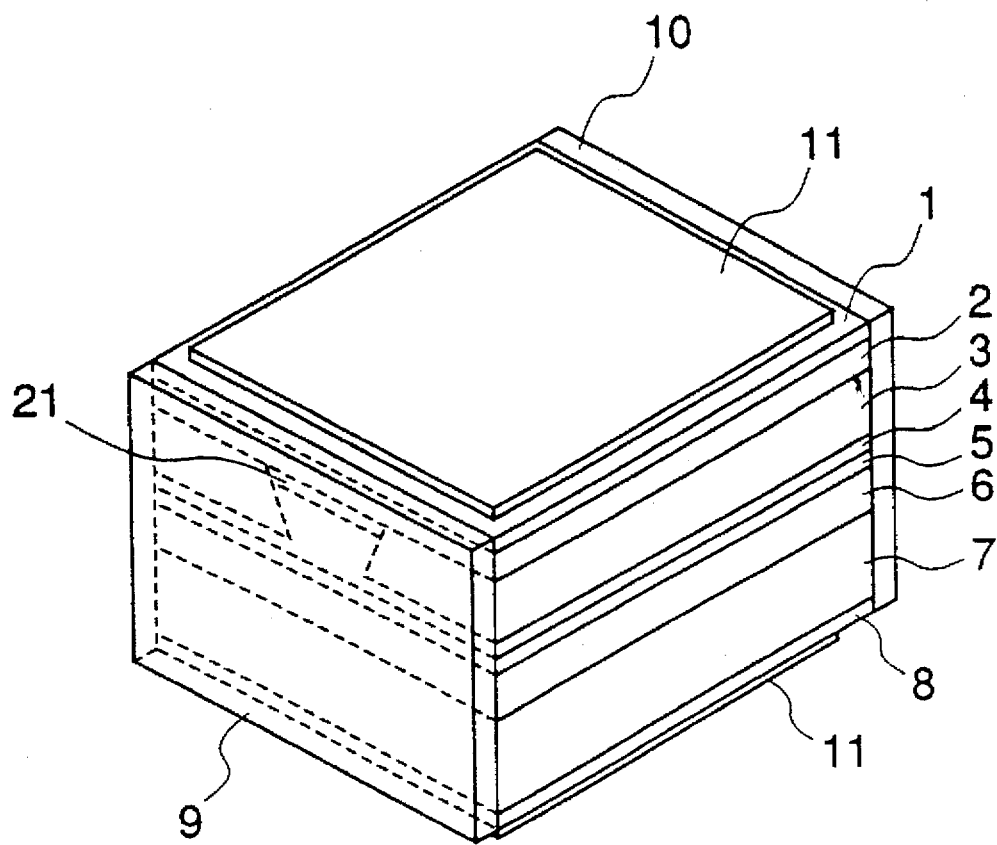
FIG. 1 is a perspective view illustrating a self-pulsation semiconductor laser device including a back facet reflection film comprising a saturable absorber in accordance with a first embodiment of the present invention.

FIG. 1 is a perspective view illustrating this semiconductor laser device. In the figure, reference numeral 7 designates an n type GaAs substrate. An n type $Al_zGa_{1-z}As$ cladding layer 6, an $Al_xGa_{1-x}As$ active layer 5, a p type $Al_zGa_{1-z}As$ cladding layer 4, an n type GaAs current blocking layer 3, and a p type GaAs contact layer 2 are successively disposed on the n type GaAs substrate 7. A p side electrode 1 is provided on the p type GaAs contact layer 2 and an n side electrode 8 is provided at a rear surface of the n type GaAs substrate 7. A back facet reflection film 9 comprising $Al_yGa_{1-y}As$ is disposed on a back facet of a resonator, and a front facet reflection film 10 comprising $Al_2O_3$ or $SiO_2$ is disposed on a front facet of the resonator. Au-plated layers 11 are disposed on the p side electrode 1 and at a rear surface of the n side electrode 8. A p type GaAs cap layer 21 is disposed on a ridge portion of the p type AlGaAs cladding layer 4. The Al composition ratio z of the cladding layers 4 and 6 is larger than the Al composition ratio x of the active layer 5 so that the AlGaAs of the cladding layers 4 and 6 has a band gap energy larger than that of the AlGaAs of the active layer 5.

In addition, since the back facet reflection film 9 comprises $Al_yGa_{1-y}As$ having an Al composition ratio y equal to or less than the Al composition ratio x and the $Al_yGa_{1-y}As$ has a band gap energy equal to or less than that of the $Al_xGa_{1-x}As$ of the active layer 5, the back facet reflection film 9 serves as a saturable absorber of the laser light which is emitted from the active layer 5. For example, assuming that the Al composition ratio x of the active layer 5 is 0.13 and the Al composition ratio y of the back facet reflection film 9 is 0.1, the wavelength $\lambda$ of the laser light is 780 nm and the refractive index $n_2$ of the back facet reflection film 9 is 3.58. Therefore, the thickness $d_2$ of the back facet reflection film 9 is $$d_2 = 54.5 + 109.0 \, M \text{ (nm)}$$
$$= 54.5 \text{ nm}, 163.5 \text{ nm}, \ldots$$

A description is given of a method of fabricating the semiconductor laser device.

Figure 2:
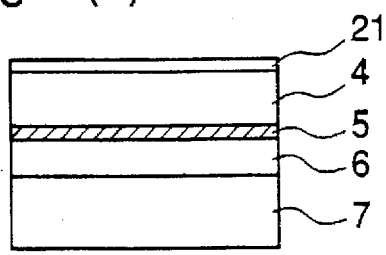
FIGS. 2(a)–2(g) are cross-sectional views and perspective views illustrating process steps in a method of fabricating the self-pulsation semiconductor laser device according to the first embodiment of the invention.
Figure 2:
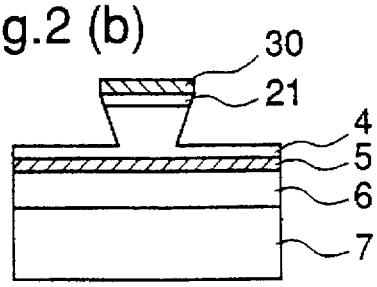
Figure 2:
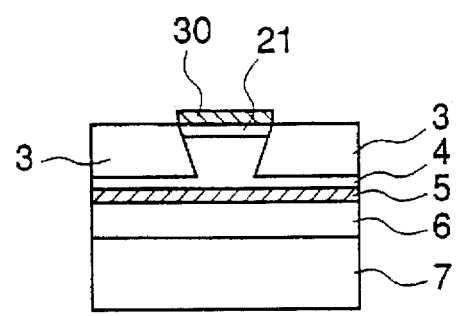
Figure 2:
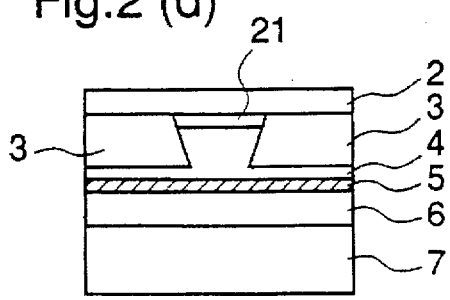
Figure 2:
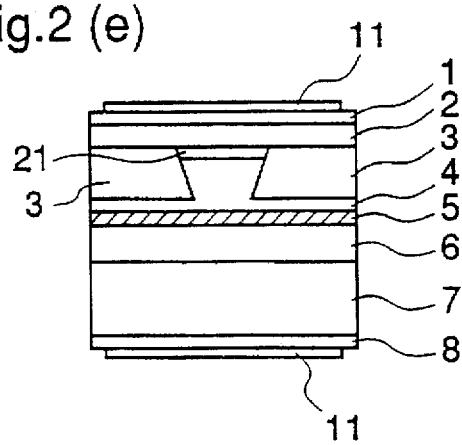
Figure 2:
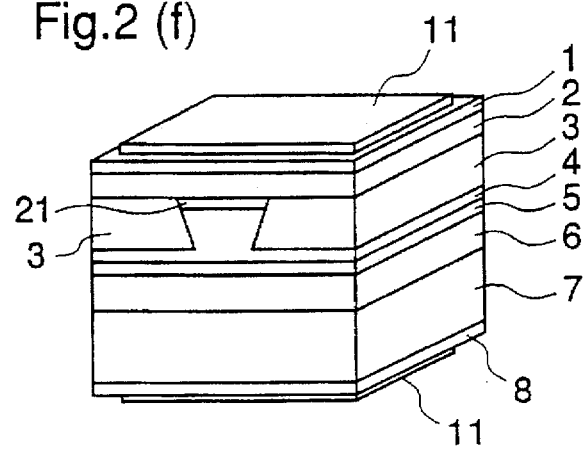
Figure 2:
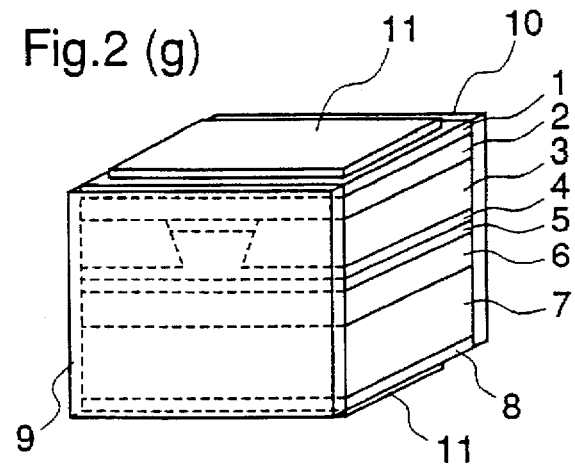

FIGS. 2(a)–2(g) are cross-sectional views and perspective views illustrating process steps in the fabricating method. Initially, as shown in FIG. 2(a), the n type $Al_zGa_{1-z}As$ cladding layer 6, the $Al_xGa_{1-x}As$ active layer 5, the p type $Al_zGa_{1-z}As$ cladding layer 4, and the p type GaAs cap layer 21 are successively epitaxially grown on the n type GaAs substrate 7, preferably, using MBE or MOCVD. In this growth, the Al composition ratio z of the cladding layers 4 and 6 is larger than the Al composition ratio x of the active layer 5. In the step of FIG. 2(b), an SiON film 30 is formed on a region of the surface of the p type GaAs cap layer 21 where a ridge portion is to be formed and, using the SiON film 30 as a mask, the p type GaAs cap layer 21 and the p type AlGaAs cladding layer 4 are selectively etched, leaving the p type AlGaAs cladding layer 4 having a prescribed thickness on the AlGaAs active layer 5 except at the ridge region. Then, as shown in FIG. 2(c), using the SiON film 30 as a mask, the n type GaAs current blocking layer 3 is selectively grown on both sides of the ridge portion, preferably using MOCVD or LPE. After removal of the SiON film 30, the p type GaAs contact layer 2 is grown on the entire surface as shown in FIG. 2(d). Thereafter, as shown in FIG. 2(e), a Cr/Au film is evaporated on the surface of the contact layer 2 to form the p side electrode 1, and the Au-plated film 11 is formed on the p side electrode 1. Further, an AuGe/Ni/Ti/Pt/Ti/Pt/Au film is evaporated on the rear surface of the n type GaAs substrate 7 to form the n side electrode 8, and the Au plated film 11 is formed on the rear surface of the n side electrode 8. Then, as shown in FIG. 2(f), chips are separated from each other by cleaving. Finally, the back facet reflection film 9 comprising $Al_yGa_{1-y}As$ and the front facet reflection film 10 comprising $Al_2O_3$ or $SiO_2$ are formed on the back and front facets of the resonator, respectively, resulting in the semiconductor laser device as shown in FIG. 2(g). In addition, the back facet reflection film 9 is grown at a low temperature, using MBE or the like, to have an Al composition ratio y equal to or less than the Al composition ratio x, whereby it serves as a saturable absorber to the laser light which is emitted from the active layer 5.

A description is given of the operation.

Figure 3:
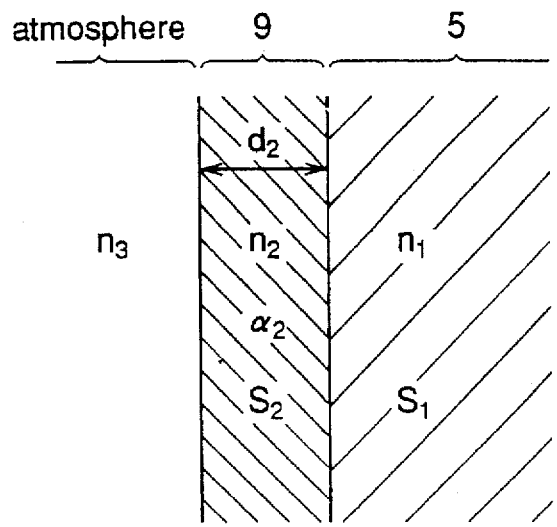
FIG. 3 is an expanded cross-sectional view illustrating the back facet reflection film and the active layer of the self-pulsation semiconductor laser device according to the first embodiment of the invention.

FIG. 3 is an expanded cross-sectional view illustrating portions of the back facet reflection film 9 and the active layer 5 adjacent the reflection film 9 in a plane parallel to the direction in which the laser light is emitted. In the figure, $n_1$ represents the effective refractive index of the active layer 5, $n_2$ represents the refractive index of the back facet reflection film 9, $n_3$ represents the refractive index of the atmosphere, $\alpha_2$ represents the absorption coefficient of the back facet reflection film 9, $S_1$ represents the luminous intensity (photon density) of the active layer 5, $S_2$ represents the luminous intensity (photon density) of the back facet reflection film 9, and $d_2$ represents the thickness of the back facet reflection film 9.

Figure 4:
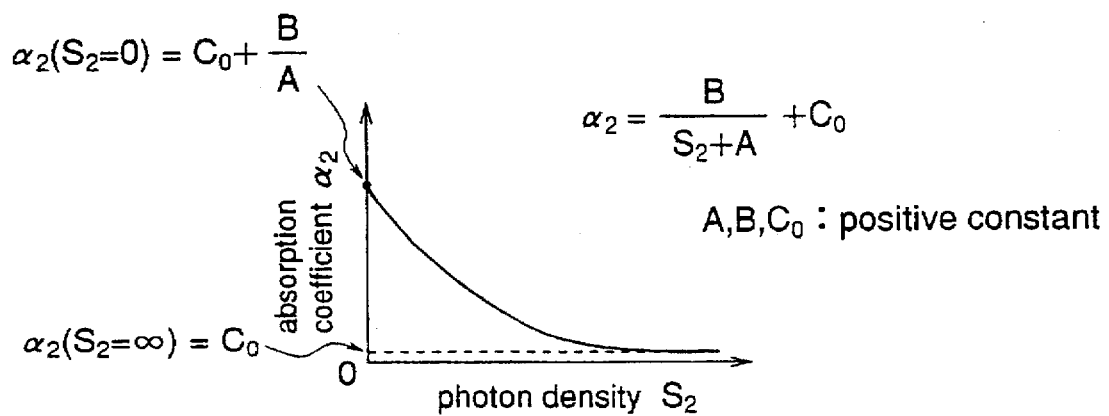
FIG. 4 is graph showing a relation between a absorption coefficient and luminous intensity (photon density) of the saturable absorber.

Generally, as shown in FIG. 4, the absorption coefficient $\alpha_2$ of the saturable absorber is a hyperbolic function of the photon density $S_2$. This is obtained, in the rate equations (2) and (4), by putting $$\frac{dS_b}{dt} = 0$$

$$\frac{dN_b}{dt} = 0$$

$$-\alpha_2 = \Gamma_b \left[ \{G'_b(N_b - N_g)\} \frac{n}{c} - \alpha_i \right]$$

where c is the velocity of light in a vacuum and $\alpha_i$ is the internal loss, by eliminating $N_b$ and substituting $S_2$ for $S_b$.

When the effective refractive index of the active layer 5 is $n_1$, the reflectivity $R_r$ of the back facet reflection film 9 comprising a saturable absorber is represented by $$R_r = \left( \frac{r_1 - r_2 e^{-2\alpha_2 d_2}}{1 - r_1 r_2 e^{-2\alpha_2 d_2}} \right)^2 \quad (7)$$

$$r_1 = \frac{n_1 - n_2}{n_1 + n_2}, \quad r_2 = \frac{n_2 - n_3}{n_2 + n_3} \quad (8)$$

Therefore, $R_r$ becomes smaller as $S_2$ becomes larger because $\alpha_2$ becomes smaller as shown in FIG. 4 and $r_1$ is almost equal to $r_2$. The photon lifetime $\tau_p$ is represented by $$1/\tau_p = \alpha_d + \frac{1}{2L} \ln \frac{1}{R_f R_r} \quad (9a)$$

where $R_f$ is the front facet reflectivity, L is the resonator length, and $\alpha_d$ is the diffraction loss of light. As is known from the equations (7) and (9a), since $\tau_p$ is a function of $R_r$, it is a function of $\alpha_2$. Consequently, $\tau_p$ is a function of S.

From the above-described relations, the rate equations in the semiconductor laser device of the first embodiment are $$\frac{dS}{dt} = \Gamma G'S(N - N_g) - \frac{1}{\tau_p} S + C \frac{N}{\tau_s} \quad (\equiv f_{11}) \quad (10)$$

$$\frac{dN}{dt} = \frac{I\eta_i}{qV} - \Gamma G'S(N - N_g) - \frac{1}{\tau_s} N (\equiv f_{12}) \quad (11)$$

where N is the electron density of the active layer, S is the photon density of the active layer, $\Gamma$ is the optical confinement coefficient of the active layer, G' is the differential gain of the active layer, $N_g$ is the transparentized carrier density of the active layer, $\tau_p$ is the photon lifetime of the active layer, $\tau_s$ is the carrier lifetime of the active layer, and C is the spontaneous emission light coefficient of the active layer.

The stability of the dynamic system denoted by the rate equations (10) and (11) depends on whether at least one of the eigenvalues of the matrix $$\begin{pmatrix} \frac{\partial f_{11}}{\partial S} & \frac{\partial f_{12}}{\partial S} \\ \frac{\partial f_{11}}{\partial N} & \frac{\partial f_{12}}{\partial N} \end{pmatrix} \quad (12)$$

has a real part which is not negative. That is, when even one of these eigenvalues has a real part which is not negative, the solutions of the rate equations (10) and (11) become unstable, so that the semiconductor laser device is self-pulsated.

The matrix (12) is specifically represented by $$\begin{pmatrix} \Gamma G'(N-N_g) - \frac{1}{\tau_p} - S \frac{\partial}{\partial S}\left(\frac{1}{\tau_p}\right) & -\Gamma G'(N-N_g) \\ \Gamma G'S + \frac{C}{\tau_s} & -\Gamma G'S - \frac{1}{\tau_s} \end{pmatrix} \equiv \begin{pmatrix} a_{11} & a_{12} \\ a_{21} & a_{22} \end{pmatrix} \quad (13)$$

In order that at least one of the eigenvalues in the matrix (12) has a real part which is not negative, it is required to satisfy at least one the conditions of $a_{11}+a_{22} \geq 0$ and $a_{11}a_{22} - a_{12}a_{21} \leq 0$, that is to say, $$\Gamma G'(N-N_g) - \frac{1}{\tau_p} - S \frac{\partial}{\partial S}\left(\frac{1}{\tau_p}\right) - \Gamma G'S - \frac{1}{\tau_s} \geq 0 \quad (14a)$$

and $$-\left\{ \Gamma G'(N-N_g) - \frac{1}{\tau_p} - S \frac{\partial}{\partial S}\left(\frac{1}{\tau_p}\right) \right\} \left\{ \Gamma G'S + \frac{1}{\tau_s} \right\} + \quad (14b)$$

$$\{\Gamma G'(N-N_g)\} \left\{ \Gamma G'S + \frac{C}{\tau_s} \right\} \leq 0$$

Since N is more than $N_g$ and S is more than 0 when the laser oscillation occurs, $a_{22}$ is less than 0, $a_{12}$ is less than 0, and $a_{21}$ is more than 0. Therefore, in (14a), it is necessary that $a_{11}$ be a sufficiently large positive value. Also in (14b), it is necessary that $a_{11}$ be a sufficiently large positive value because of $a_{22}<0$. Consequently, the necessary and sufficient condition for producing self-pulsation is $$a_{11} = \Gamma G'(N-N_g) - \frac{1}{\tau_p} - S \frac{\partial}{\partial S}\left(\frac{1}{\tau_p}\right) \gg 0 \quad (14c)$$

Now, from the equation (9a)

$$\frac{\partial}{\partial S}\left(\frac{1}{\tau_p}\right)=\frac{\partial R_r}{\partial S}\cdot\left(-\frac{1}{2LR_r}\right) \quad (9b)$$

is obtained. In addition, owing to $$\frac{\partial R_r}{\partial S}<0$$

$$\frac{\partial}{\partial S}\left(\frac{1}{\tau_p}\right)>0$$

is found from the equation (9b). Therefore, in order for $a_{11}\gg 0$, the first and second terms of $a_{11}$ in the matrix (13) must be $$\Gamma G'(N-N_g)-\frac{1}{\tau_p}\gg 0 \quad (14d)$$

The back facet reflectivity $R_r$ becomes closer to 0 as S becomes larger, and it is closer to 1 as S becomes smaller. Therefore, $-1/\tau_p$ becomes smaller as S becomes larger, and becomes larger as S becomes smaller. In addition, as S is larger, the carrier density N is larger because $1/\tau_p$ becomes larger and, as S becomes smaller, N becomes smaller because $1/\tau_p$ becomes smaller. Accordingly, whether S becomes larger or smaller, it is probable to get a positive value for the left side in (14d) as compared with the prior art semiconductor laser device. Consequently, the solutions (N, S) which are obtained from the rate equations (10) and (11) are more unstable than in the prior art semiconductor laser device, whereby it is probable that the semiconductor laser device according to the first embodiment provides self-pulsated laser oscillation.

As described above, according to the first embodiment of the invention, since the back facet reflection film 9 of the resonator in the semiconductor laser device comprises the material serving as a saturable absorber to the laser light, self-pulsation in which the emitted light is pulsed light having a high frequency occurs easily, independently of the differences in optical confinement coefficient Γ and in differential gain G' between the region where a current flows and the region where no current flows in the active layer. More specifically, the semiconductor laser device, in which laser characteristics, such as a transverse mode characteristic and a threshold current characteristic, are better and self-pulsation occurs more easily than in the prior art semiconductor laser device, is obtained. Therefore, in the self-pulsation semiconductor laser device of the first embodiment, a wider margin of device design is afforded than in the prior art device, whereby the self-pulsation semiconductor laser device is stably fabricated and its yield is improved.

In addition, in the semiconductor laser device, the active layer 5 may comprise $Al_{x1}Ga_{y1}In_{1-x1-y1}P$ and the back facet reflection film 9 may comprise $Al_{x2}Ga_{y2}In_{1-x2-y2}P$. In this case, the values of x1, x2, y1, and y2 are taken so that a band gap energy $E_g$ of a active layer is equal to or larger than a band gap energy $E_g$ of a back facet reflection film. As the result, the back facet reflection film 9 serves as a saturable absorber for the laser light which is emitted from the active layer 5. AlGaInP of the cladding layers 4 and 6 has an Al composition ratio larger than that of the active layer 5.

AlGaInP may be used for the active layer 5 and AlGaAs may be used for the back facet reflection film 9, provided that the compositions of AlGaInP and AlGaAs are determined so that the band gap energy $E_g$ of the active layer is equal to or larger than the band gap energy $E_g$ of the back facet reflection film. Also in this case, the AlGaInP of the cladding layers 4 and 6 has an Al composition ratio larger than that of the active layer 5.

The active layer 5 may comprise ZnMgSSe or ZnMgCdSSe and the back facet reflection film 9 may comprise AlGaAs or AlGaInP. In addition, the composition ratios of the respective elements in the active layer and the back facet reflection film are determined so that the band gap energy $E_g$ of the active layer is equal to or larger than the band gap energy $E_g$ of the back facet reflection film. In this case, ZnSSe is used for the cladding layers 4 and 6 and GaAs is used for the substrate.

The active layer 5 may comprise $In_{x1}Ga_{1-x1}As_{y1}P_{1-y1}$ and the back facet reflection film 9 may comprise $In_{x2}Ga_{1-x2}As_{y2}P_{1-y2}$. The values of x1, x2, y1, and y2 are taken so that the band gap energy $E_g$ of the active layer is equal to or larger than the band gap energy $E_g$ of the back facet reflection film. In this case, the cladding layers 4 and 6 comprise InGaAsP having a band gap energy larger than that of the active layer 5 and the substrate comprises InP.

AlGaAs, AlGaInP, ZnMgSSe, or ZnMgCdSSe may be used for the active layer 5 and InGaAsP may be used for the back facet reflection film 9. Also in this case, the compositions of the active layer and the back facet reflection film are determined so that the band gap energy $E_g$ of the active layer is equal to or larger than the band gap energy $E_g$ of the back facet reflection film.

The active layer 5 may comprise InGaAsP, AlGaAs, AlGaInP, ZnMgSSe, or ZnMgCdSSe and the back facet reflection film 9 may comprise Ge. In this case, the back facet reflection film comprising Ge can be grown by MBE or vacuum evaporation.

Figure 5:
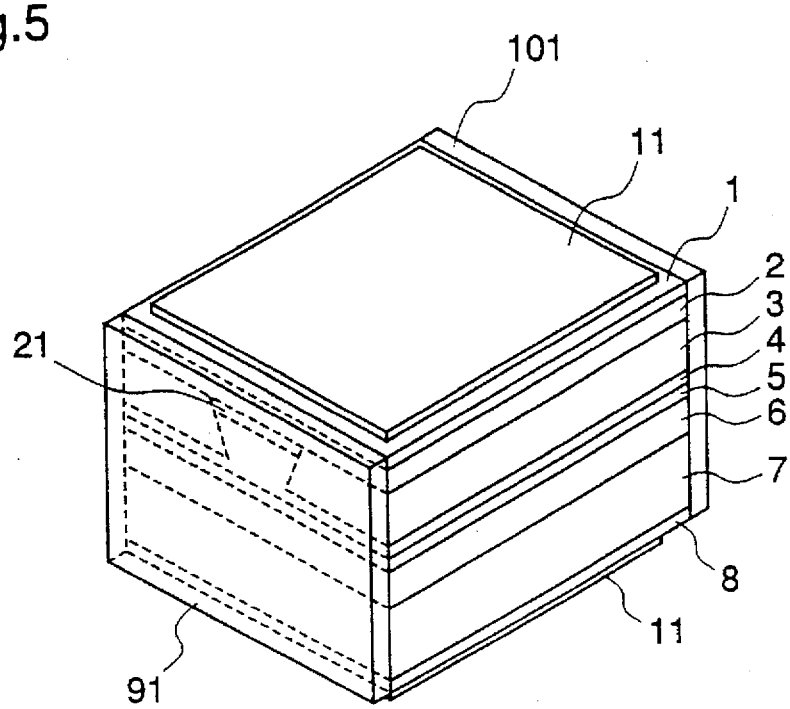
FIG. 5 is a perspective view illustrating a self-pulsation semiconductor laser device including a front facet reflection film comprising a saturable absorber according to the first embodiment of the invention.

While in the above-described semiconductor laser device, the back facet reflection film 9 comprises a saturable absorber as shown in FIG. 1, a front facet reflection film 101 may comprise a saturable absorber as shown in FIG. 5. The operation of this semiconductor laser device is explained by replacing $R_f$ and $R_r$ with each other in the description of the operation of the semiconductor laser device in which the back facet reflection film 9 comprises a saturable absorber. Therefore, a semiconductor laser device, in which laser characteristics are good and self-pulsation occurs as easily as in the semiconductor laser device shown in FIG. 1, is obtained. In this case, a back facet reflection film 91 can comprise instead of a saturable absorber, a material having a high reflectivity, such as a film comprising multiple laminated layers of $SiO_2$ and Si. Therefore, the intensity of emitted light is increased as compared with the semiconductor laser device shown in FIG. 1.

Figure 6:
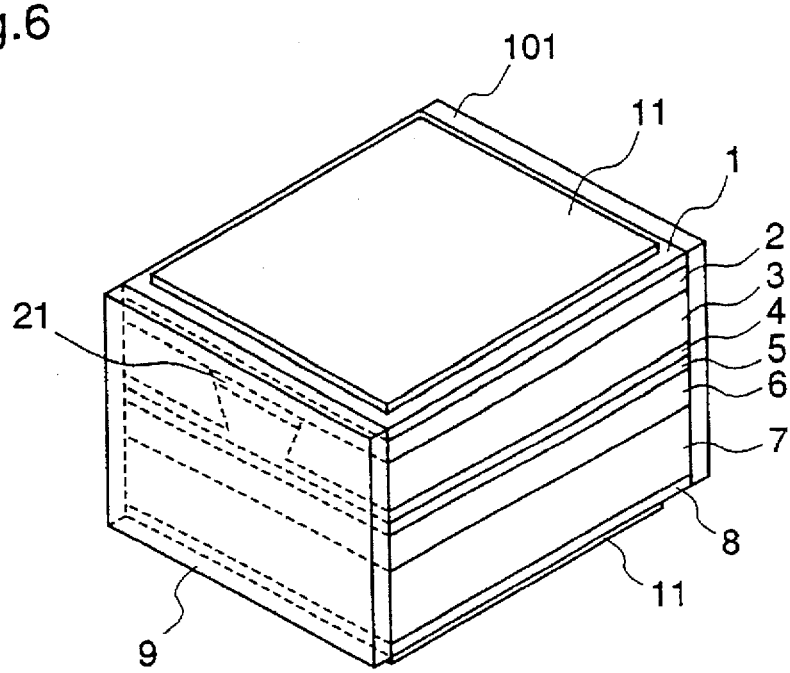
FIG. 6 is a perspective view illustrating a self-pulsation semiconductor laser device including front and back facet reflection films respectively comprising saturable absorbers according to the first embodiment of the invention.

While in the above-described semiconductor laser device, a saturable absorber is used for only one of the front and back facet reflection films, it may be used for both of the front and back facet reflection films 101 and 9 as shown in FIG. 6. Also in this case, the same effects as in the semiconductor laser device shown in FIG. 1 are obtained.

[Embodiment 2]

A description is given of a second embodiment of the present invention.

Figure 7:
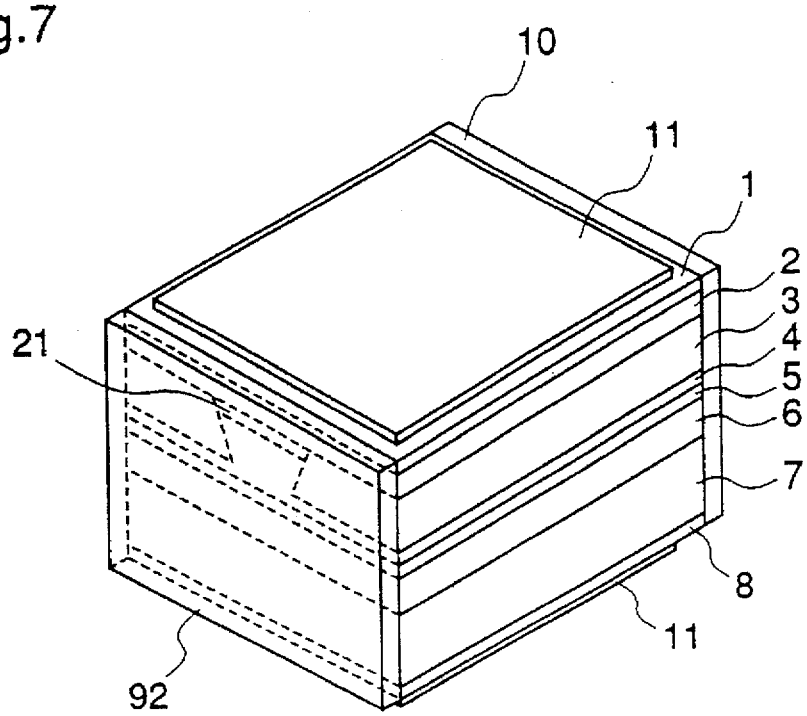
FIG. 7 is a perspective view illustrating a self-pulsation semiconductor laser device including a back facet reflection film comprising a nonlinear optical material in accordance with a second embodiment of the present invention.

A semiconductor laser device according to the second embodiment is a self-pulsation semiconductor laser device including a reflection film on a back facet of a resonator comprising a nonlinear optical material. FIG. 7 is a perspective view illustrating the self-pulsation semiconductor laser device of the second embodiment. In the figure, the same reference numerals as in FIG. 1 designate the same parts, and a detailed description is omitted. In the first embodiment of the invention, since the back facet reflection film comprises a saturable absorber, the back facet reflectivity $R_r$ becomes smaller as the photon density S becomes larger. Meanwhile, in this second embodiment, a back facet reflection film 92 comprises a nonlinear optical material of which the refractive index $n_2$ varies depending on the photon density $S_2$. In addition, the thickness $d_2$ of the back facet reflection film 92 is represented, with regard to the refractive index $n_2$ when the photon density $S_2$ is large, by $$d_2 = \frac{\lambda}{n_2} \left( \frac{M}{2} + \frac{1}{4} \right) (M=0, 1, 2 \ldots) \quad (17)$$

where $\lambda$ is the wavelength of the laser light.

Figure 8:
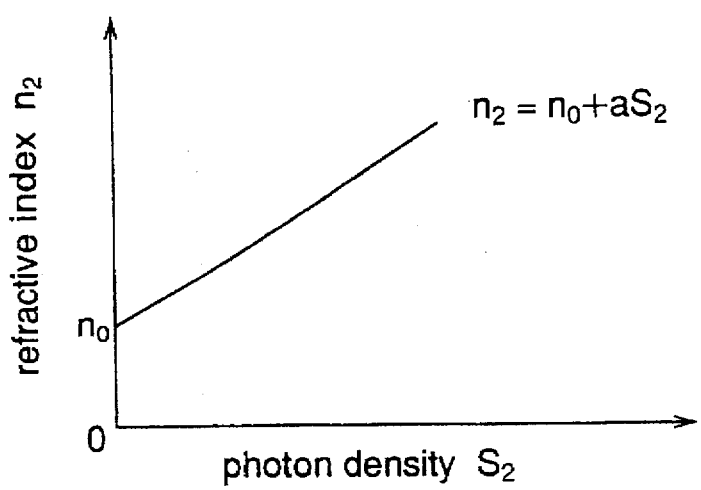
FIG. 8 is a graph showing a relation between a refractive index and a photon density of the nonlinear optical material having third-order nonlinearity.

As an example of photon density dependency of the refractive index of the nonlinear optical material, FIG. 8 shows a relation between a refractive index $n_2$ and a photon density $S_2$ of the a nonlinear optical material having third-order nonlinearity to an electric field (which is proportional to $\sqrt{S_2}$ in magnitude).

MNA (2-methyl-4-nitroaniline) may be used as the nonlinear optical material of the back facet reflection film 92. MNA is one of the nonlinear optical materials having third-order nonlinearity to an electric field. For example, assuming that a light emitting region of the semiconductor laser is 2 μm×2 μm, $n_2$ is 2.1 when a light output is 10 mW and $n_2$ is 1.8 when a light output is 0 mW. Therefore, the refractive index varies depending on the photon density.

In a method of fabricating the semiconductor laser device according to the second embodiment, processes for growing semiconductor layers and separating respective chips from each other by cleaving and a process for forming a front facet reflection film 10 are just the same as the processes shown in FIGS. 2(a)–2(g) according to the first embodiment. The back facet reflection film 92 is formed by dissolving MNA in an organic solvent, such as acetone, and coating the back facet of the resonator of the laser with the MNA, producing condensation polymerization, preferably due to heat treatment, and adhering the MNA on the back facet.

A description is given of the operation of the semiconductor laser device.

The reflectivity $R_r$ of the back facet reflection film is represented by $$R_r = \left( \frac{r_1 + r_2 e^{i\frac{4d_2 n_2}{\lambda} \pi}}{1 + r_1 r_2 e^{i\frac{4d_2 n_2}{\lambda} \pi}} \right)^2, r_1 = \frac{n_1 - n_2}{n_1 + n_2}, r_2 = \frac{n_2 - n_3}{n_2 + n_3} \quad (18)$$

When the photon density $S_2$ of the back facet reflection film 92 is large, assuming that M is 0 in the equation (17), $$e^{i\frac{4d_2 n_2}{\lambda} \pi} = e^{i\pi} = -1$$

is obtained. Therefore, $R_r$ is close to 0 when $r_1$ is almost equal to $r_2$.

Meanwhile, as the photon density $S_2$ becomes smaller, $n_2$ becomes smaller, whereby the back facet reflection film 92 does not have a low reflectivity and the reflectivity $R_r$ becomes large. The photon density $S_2$ of the back facet reflection film 92 has the following relation to the photon density $S_1$ of the active layer 5.

$$\frac{S_2}{S_1} = \frac{r_1^2}{1 - r_1^2} \quad (19)$$

Since variation in $S_2/S_1$ due to variation in $S_1$ is small as compared with variation in $R_r$ due to $S_1$, it is supposed that $S_2$ is almost proportional to $S_1$. Therefore, $R_r$ becomes smaller as the photon density $S_1$ of the active layer 5 becomes larger and $R_r$ becomes larger as $S_1$ becomes smaller. Consequently, the solutions which are obtained from the rate equations (10) and (11) become more unstable as in the first embodiment of the invention, whereby self-pulsation occurs easily.

For example, when the back facet reflection film 92 comprises MNA, the reflectivity $R_r$ varies depending on the light output. That is, in the case that the thickness $d_2$ of the back facet reflection film is $(3/4)\lambda$, $R_r$ is 2.5% when the light output is 10 mW and it is 16.8% when the light output is 0 mW. In addition, in the case that the thickness $d_2$ is $(5/4)\lambda$, $R_r$ is 2.5% when the light output is 10 mW and it is 25% when the light output is 0 mW, and the range of the variation is widened.

As described above, according to the second embodiment of the invention, since the back facet reflection film 92 of the resonator in the semiconductor laser device comprises a nonlinear optical material, self-pulsation in which the emitted light is pulsed light having a high frequency occurs easily, independently of the differences in optical confinement coefficient Γ and in differential gain G' between the region where a current flows and the region where no current flows in the active layer 5. More specifically, a semiconductor laser device, in which laser characteristics, such as a transverse mode characteristic and a threshold current characteristic, are better and the self-pulsation occurs more easily than in the prior art self-pulsation semiconductor laser device, is obtained. Therefore, in the self-pulsation semiconductor laser device of the second embodiment, a wider margin of device design is afforded than in the prior art device, whereby the self-pulsation semiconductor laser device is stably fabricated and its yield is improved.

In addition, in the above-described semiconductor laser device, MNA is used as the nonlinear optical material of the back facet reflection film 92. However, PTS polydiacetylene may be used. PTS polydiacetylene is one of the nonlinear optical materials having a third-order nonlinearity to an electric field. In this case, a refractive index for a light output of 10 mW is 2.9 and a refractive index for a light output of 0 mW is 1.9, and a wide range of the refractive index is realized as in a case where MNA is used. The method of forming the back facet reflection film 92 comprising PTS polydiacetylene is the same as the method of forming the back facet reflection film comprising MNA.

Figure 9:
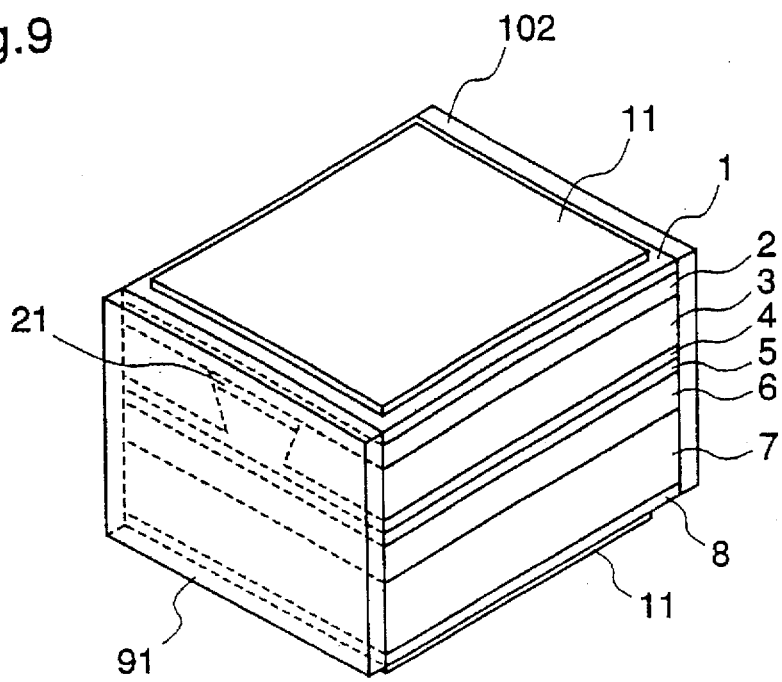
FIG. 9 is a perspective view illustrating a self-pulsation semiconductor laser device including a front facet reflection film comprising a nonlinear optical material according to the second embodiment of the invention.

While in the semiconductor laser device, the back facet reflection film 92 comprises a nonlinear optical material as shown in FIG. 7, a front facet reflection film 102 may comprise a nonlinear optical material as shown in FIG. 9. The operation of this semiconductor laser device is the same as the operation of the semiconductor laser device in which the back facet reflection film 92 comprises a nonlinear optical material. Therefore, a semiconductor laser device, in which laser characteristics are good and self-pulsation occurs easily, is obtained. In this case, since a back facet reflection film 91 can comprise instead of a nonlinear optical material, a material having a high reflectivity, such as a film comprising multiple laminated layers of $SiO_2$ and Si, the intensity of emitted light is increased as compared with the semiconductor laser device shown in FIG. 7.

Figure 10:
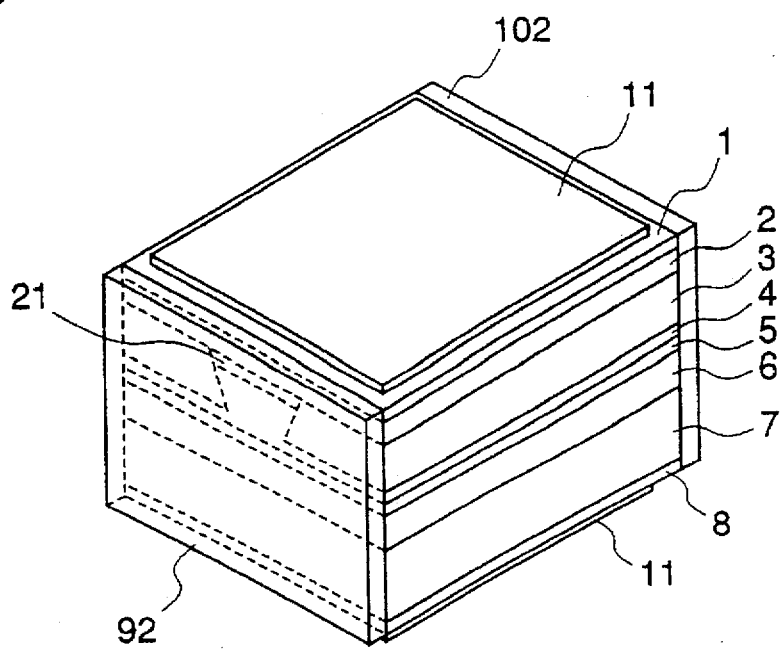
FIG. 10 is a perspective view illustrating a self-pulsation semiconductor laser device including front and back facet reflection films of a resonator respectively comprising nonlinear optical materials according to the second embodiment of the invention.
Figure 11:
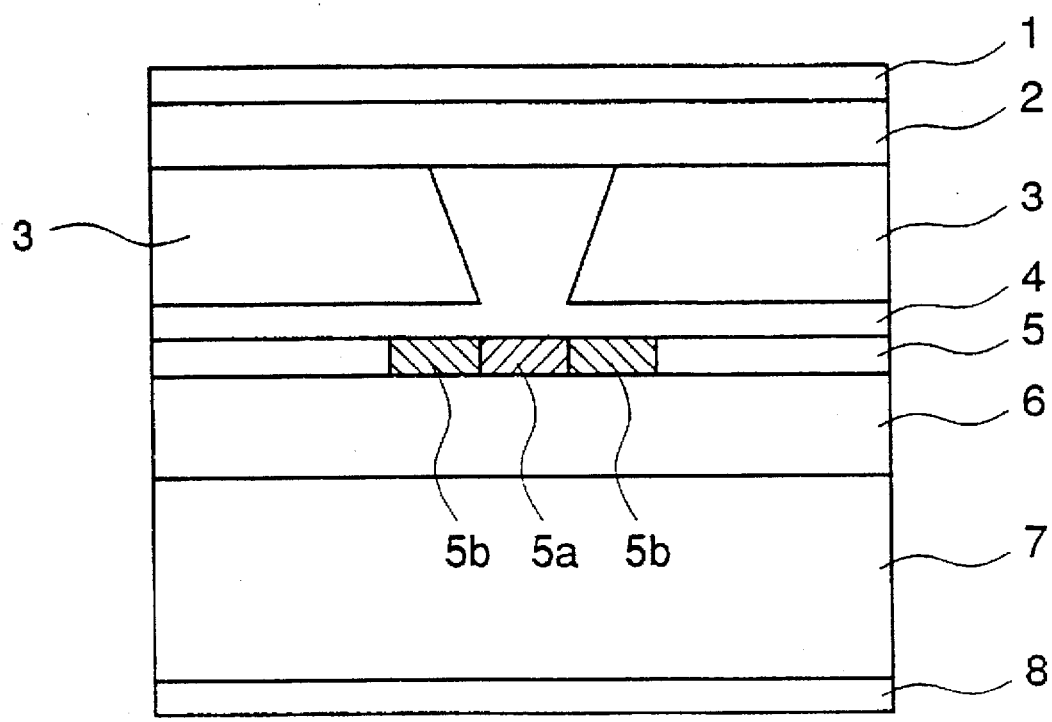
FIG. 11 is a cross-sectional view illustrating a prior art self-pulsation semiconductor laser device.

While in the above-described semiconductor laser device, a nonlinear optical material is used for only one of the front and back facet reflection films, it may be used for both of the front and back facet reflection films 102 and 92 as shown in FIG. 10. Also in this case, the same effects as in the semiconductor laser device shown in FIG. 7 are obtained.

What is claimed is:

1. A semiconductor laser device including:

a resonator including an active layer from which laser light of wavelength λ is emitted, a front facet, and a rear facet;

a front facet reflection film having a thickness and a refractive index and disposed on the front facet;

a back facet reflection film having a thickness and a refractive index and disposed on the rear facet, at least one of the front and back facet reflection films comprising a saturable absorber absorbing a portion of the laser light that changes inversely with intensity of the laser light and having a thickness d where $$d = \frac{\lambda}{n} \left( \frac{1}{4} + \frac{M}{2} \right) (M = 0, 1, 2 \ldots)$$

and n is the refractive index of the facet reflection film comprising a saturable absorber.

2. The semiconductor laser device of claim 1 wherein:

the active layer is AlGaAs; and the saturable absorber comprises AlGaAs having a band gap energy smaller than the active layer.

3. The semiconductor laser device of claim 1 wherein:

the active layer is AlGaInP; and the saturable absorber comprises AlGaInP having a band gap energy smaller than the active layer.

4. The semiconductor laser device of claim 1 wherein:

the active layer is AlGaInP; and the saturable absorber comprises AlGaAs having a band gap energy smaller than the active layer.

5. The semiconductor laser device of claim 1 wherein:

the active layer is selected from the group consisting of ZnMgSSe and ZnMgCdSSe; and the saturable absorber is selected from the group consisting of AlGaAs and AlGaInP and has a band gap energy smaller than the active layer.

6. The semiconductor laser device of claim 1 wherein:

the active layer is InGaAsP; and the saturable absorber comprises InGaAsP having a band gap energy smaller than the active layer.

7. The semiconductor laser device of claim 1 wherein:

the active layer is selected from the group consisting of AlGaAs, AlGaInP, ZnMgSSe, and ZnMgCdSSe; and the saturable absorber comprises InGaAsP having a band gap energy smaller than the active layer.

8. The semiconductor laser device of claim 1 wherein:

the active layer is selected from the group consisting of AlGaAs, AlGaInP, ZnMgSSe, ZnMgCdSSe, and InGaAsP; and the saturable absorber comprises Ge having a band gap energy smaller than the active layer.

9. A semiconductor laser device including:

a resonator including an active layer from which laser light of wavelength λ is emitted, a front facet, and a rear facet;

a front facet reflection film having a thickness and a refractive index and disposed on the front facet;

a back facet reflection film having a thickness and a refractive index and disposed on the rear facet, at least one of the front and back facet reflection films comprising an organic nonlinear optical material having a refractive index varying directly with intensity of the laser light and a thickness d where $$d = \frac{\lambda}{n} \left( \frac{1}{4} + \frac{M}{2} \right) (M = 0, 1, 2 \ldots)$$

and n is the refractive index of the facet reflection film comprising a nonlinear optical material.

10. The semiconductor laser device of claim 9 wherein the organic nonlinear optical material comprises 2-methyl-4-nitroaniline.

11. The semiconductor laser device of claim 9 wherein the organic nonlinear optical material comprises PTS polydiacetylene.

* * * * *